United States Patent
Bae et al.

(10) Patent No.: US 7,362,042 B2
(45) Date of Patent: Apr. 22, 2008

(54) PLASMA DISPLAY DEVICE HAVING A THERMAL CONDUCTION MEDIUM

(75) Inventors: Sung-Won Bae, Suwon (KR); Joon-Hyeong Kim, Cheonan (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/649,776

(22) Filed: Jan. 5, 2007

(65) Prior Publication Data

US 2007/0109753 A1    May 17, 2007

Related U.S. Application Data

(63) Continuation of application No. 10/867,740, filed on Jun. 16, 2004, now Pat. No. 7,176,605.

(30) Foreign Application Priority Data

Jun. 23, 2003    (KR) ................ 2003-40718

(51) Int. Cl.
    *H01J 7/24*    (2006.01)
    *H05K 7/20*    (2006.01)
(52) U.S. Cl. ....................... 313/46; 361/704
(58) Field of Classification Search ........ 313/582–587, 313/25, 41, 42, 44, 46
    See application file for complete search history.

(56) References Cited

U.S. PATENT DOCUMENTS

| | | |
|---|---|---|
| 5,541,618 A | 7/1996 | Shinoda |
| 5,661,500 A | 8/1997 | Shinoda et al. |
| 5,663,741 A | 9/1997 | Kanazawa |
| 5,674,553 A | 10/1997 | Sinoda et al. |
| 5,724,054 A | 3/1998 | Shinoda |
| 5,786,794 A | 7/1998 | Kishi et al. |
| 5,831,374 A | 11/1998 | Morita et al. |
| 5,952,782 A | 9/1999 | Nanto |
| 5,971,566 A | 10/1999 | Tani et al. |

(Continued)

FOREIGN PATENT DOCUMENTS

JP    10-172446    6/1998

(Continued)

OTHER PUBLICATIONS

"Final Draft International Standard", Project No. 47C/61988-1/Ed. 1; Plasma Display Panels—Part 1: Terminology and letter symbols, published by International Electrotechnical Commission, IEC. in 2003, Appendix A—Description of Technology, Annex B—Relationship Between Voltage Terms And Discharge Characteristics; Annex C—Gaps and Annex D—Manufacturing.

*Primary Examiner*—Joseph Williams
*Assistant Examiner*—Bumsuk Won
(74) *Attorney, Agent, or Firm*—Robert E. Bushnell, Esq.

(57) ABSTRACT

A plasma display device includes a plasma display panel. A chassis base is disposed substantially parallel to the plasma display panel, and a thermal conduction medium is interposed between and closely contacting the plasma display panel and the chassis base. The thermal conduction medium is a composite sheet having a thermal conductivity which is greater in a planar direction of the composite sheet than the thermal conductivity in a thickness direction of the composite sheet.

16 Claims, 5 Drawing Sheets

U.S. PATENT DOCUMENTS

| | | |
|---|---|---|
| RE37,444 E | 11/2001 | Kanazawa |
| 6,353,288 B1 | 3/2002 | Asano et al. |
| 6,630,916 B1 | 10/2003 | Shinoda |
| 6,707,436 B2 | 3/2004 | Setoguchi et al. |
| 7,176,605 B2 * | 2/2007 | Bae et al. ............... 313/46 |
| 2002/0006051 A1 | 1/2002 | Yano et al. |
| 2002/0011660 A1 * | 1/2002 | Ebihara et al. ............. 257/712 |
| 2002/0195937 A1 | 12/2002 | Kim |
| 2002/0197487 A1 | 12/2002 | Bier et al. |
| 2003/0102789 A1 | 6/2003 | Kim et al. |
| 2004/0091713 A1 * | 5/2004 | Suwa et al. ............... 428/421 |
| 2004/0233133 A1 | 11/2004 | Kong et al. |

FOREIGN PATENT DOCUMENTS

| | | |
|---|---|---|
| JP | 2845183 | 10/1998 |
| JP | 2917279 | 4/1999 |
| JP | 11-251777 | 9/1999 |
| JP | 2001-043804 | 2/2001 |
| JP | 2001-325888 | 11/2001 |
| JP | 2002-156913 | 5/2002 |

* cited by examiner

PLASMA DISPLAY DEVICE HAVING A THERMAL CONDUCTION MEDIUM

CROSS REFERENCE TO RELATED APPLICATIONS

This application is a Continuation of Applicants' patent application Ser. No. 10/867,740 filed in the U.S. Patent & Trademark Office on 16 day of Jun. 2004, now U.S. Pat. No. 7,176,605 and assigned to the assignee of the present invention. All benefits accruing under 35 U.S.C. §120 from the parent application are also hereby claimed.

CLAIM OF PRIORITY

This application makes reference to, incorporates the same herein, and claims all benefits accruing under 35 U.S.C. §119 from an application for PLASMA DISPLAY DEVICE earlier filed in the Korean Intellectual Property Office on 23 day of Jun. 2003 and there duly assigned Ser. No. 2003-40718.

BACKGROUND OF THE INVENTION

1. Technical Field

The present invention relates to a plasma display device and, more particularly, to a plasma display device having an assembly for efficiently discharging heat generated by a plasma display panel (PDP) to the exterior of the plasma display device.

2. Related Art

A PDP of a plasma display device displays images thereon using plasma generated by gas discharge. The PDP generates much heat during operation as a result of the high-temperature discharge gas. Further, if the amount of discharge is increased in an effort to improve brightness, an even greater amount of heat is generated in the plasma display device. This heat must be efficiently discharged to the exterior of the device to enable good operation of the same.

Therefore, in the conventional plasma display device, the PDP is attached to a chassis base made of a high thermal-conductivity material, and a heat discharge sheet (or a thermal conduction sheet) is interposed between the PDP and the chassis base. The heat discharge sheet and the chassis base expel the heat generated by the PDP to the exterior of the device. The chassis base is typically manufactured through a die casting process or a press process using a metal material, while the heat discharge sheet is made of an acryl- or silicone-based resin.

Many different configurations have been suggested to improve the heat discharge efficiency of heat discharge sheets. The following describes one such configuration.

A cushioning material is attached along the circumference of the panel, and then a liquid thermal conduction material is applied to the region surrounded by the shock-absorbing material. The thermal conduction material is then hardened. Next, the display panel is attached to the solid thermal conduction material to thereby realize a plasma display panel that promotes heat discharge efficiency. Such a structure is disclosed in Japanese Laid-Open Patent No. Hei 10-172446.

However, a drawback of this configuration is that the thermal conduction material has an isotropic structure that exhibits the same thermal conduction characteristics in all directions. As a result, it is difficult to minimize localized temperature differences caused by variations in image patterns.

Further, a plasma display device is disclosed in Japanese Laid-Open Patent No. Hei 11-251777 in which a thermal conduction sheet is interposed between a PDP and a thermal conduction plate (chassis base), while heat pipes, heat discharge pins, and a heat discharge plate are mounted on a rear surface of the thermal conduction plate. The plasma display device realizes a uniform distribution of heat through this structure. However, such a structure runs counter to efforts to obtain a slim profile and minimize noise generation.

In cases wherein there are differences in the image pattern, heat may be concentrated at specific areas and bright image sticking may result. "Bright image sticking" relates to a situation wherein a localized area on the screen stays momentarily brighter than its surroundings after a relatively bright image has been displayed in this localized area. An example of how bright image sticking may be generated is described with reference to FIG. 5. As one can see from FIG. 5, after a full white pattern was continuously displayed on the screen of a PDP 50 for 20 minutes, 3% window pattern A, a white region in which 3% load ratio is provided, is displayed for 10 minutes. Then, if a full white pattern is again displayed on the screen, a difference in brightness occurs between two portions corresponding to window pattern A and its surrounding area B, respectively. The 3% window pattern A refers to a white region in which a load ratio of as much as 3% is provided. This is a result of the phosphor illumination operation being affected by temperature. The difference in temperature between the 3% window pattern A and the surrounding area B is particularly large when the bright image sticking starts, and this temperature difference becomes even larger with increases in a peak brightness.

The generation of bright image sticking reduces picture quality. Therefore, there is a need for heat discharge sheets that provide for a greater thermal conductivity in the planar direction than in the thickness direction of PDP such that heat therefrom can be spread more uniformly so as to realize a more uniform heat distribution of the same.

SUMMARY OF THE INVENTION

The present invention has been developed to solve above-mentioned problems. It is, therefore, an object of the invention to provide a plasma display device including a composite sheet having a large anisotropic thermal conductivity in which thermal conductivity in a planar direction is greater than in a thickness direction of a plasma display panel (PDP) of the device.

To attain the above object, according to an exemplary embodiment of the present invention, a plasma display device includes a plasma display panel and a chassis base mounted substantially parallel to the plasma display panel, with a thermal conduction medium being interposed between and closely contacting the plasma display panel and the chassis base. The thermal conduction medium is made of a composite sheet having thermal conductivity in a planar direction greater than that in a thickness direction thereof.

Preferably, the thermal conductivity of the composite sheet in the planar direction is between 5 and 500 times that in the thickness direction thereof, that is, between 10 and 1000 W/mK.

The composite sheet has a multi-layered structure of at least three layers, and each layer has a thermal conductivity different from that of an adjacent layer.

In another exemplary embodiment of the present invention, the thermal conduction medium is made of a composite sheet having a multi-layered structure of at least three layers wherein a high thermal conductivity layer made of a material with a high thermal conductivity alternates with a low thermal conductivity layer made of a material with thermal conductivity less than the high thermal conductivity. The thermal discharge sheet is structured such that thermal conductivity in the planar direction is greater than that in the thickness direction of the composite sheet.

The high thermal conductivity layer can be made of at least one material selected from the group consisting of carbon, graphite, carbon nanotubes, copper, aluminum, gold, silver, bronze, iron, and zinc. The low thermal conductivity layer can be made of a silicone- or acryl-based high polymer adhesive.

Preferably, at least one of the two outermost layers of the composite sheet is made of a low thermal conductivity layer.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE DRAWINGS

Exemplary embodiments of the present invention will now be described in detail with reference to the accompanying drawings.

Figure 1:
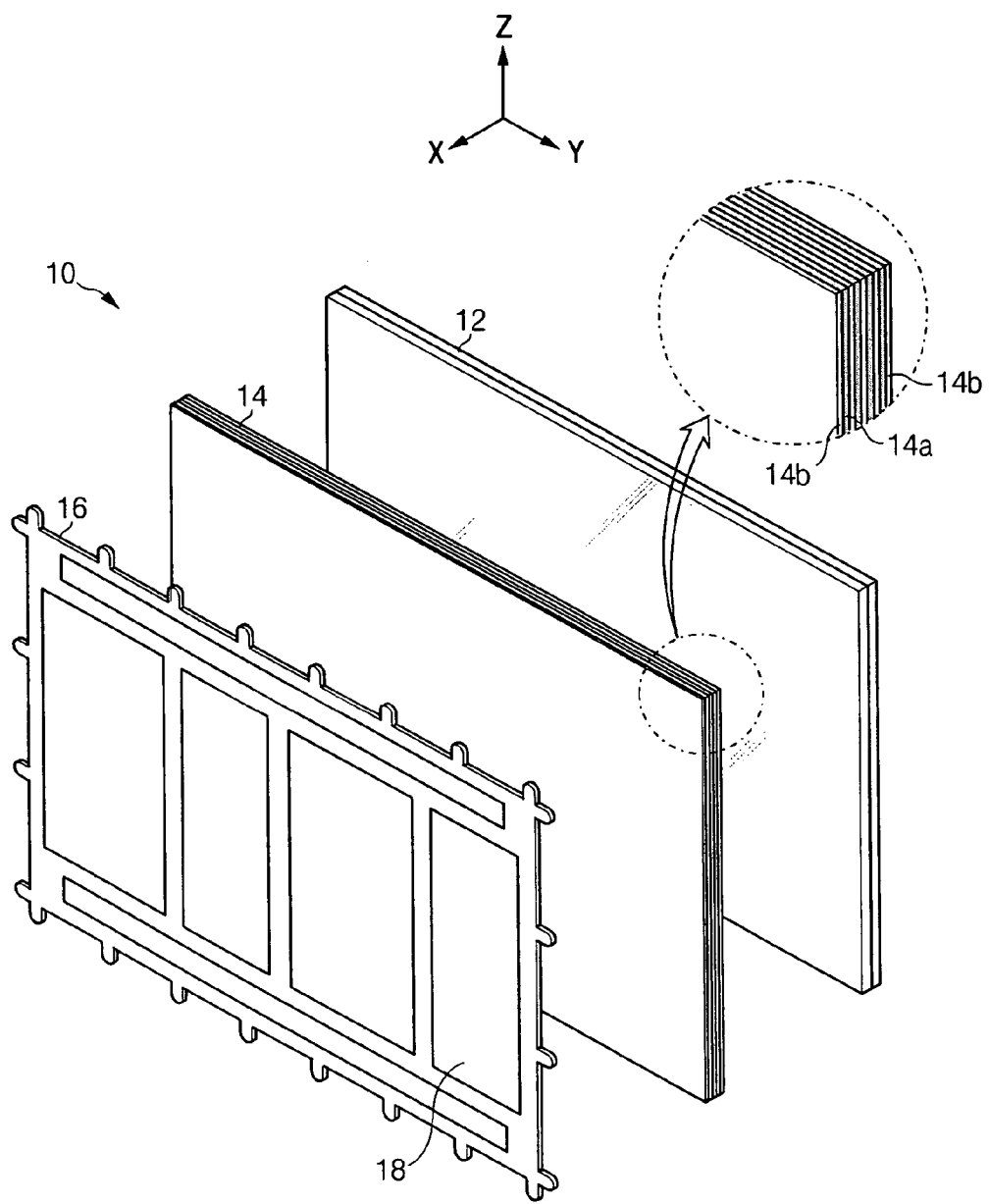
FIG. 1 is an exploded perspective view of a plasma display device according to an exemplary embodiment of the present invention.
Figure 2:
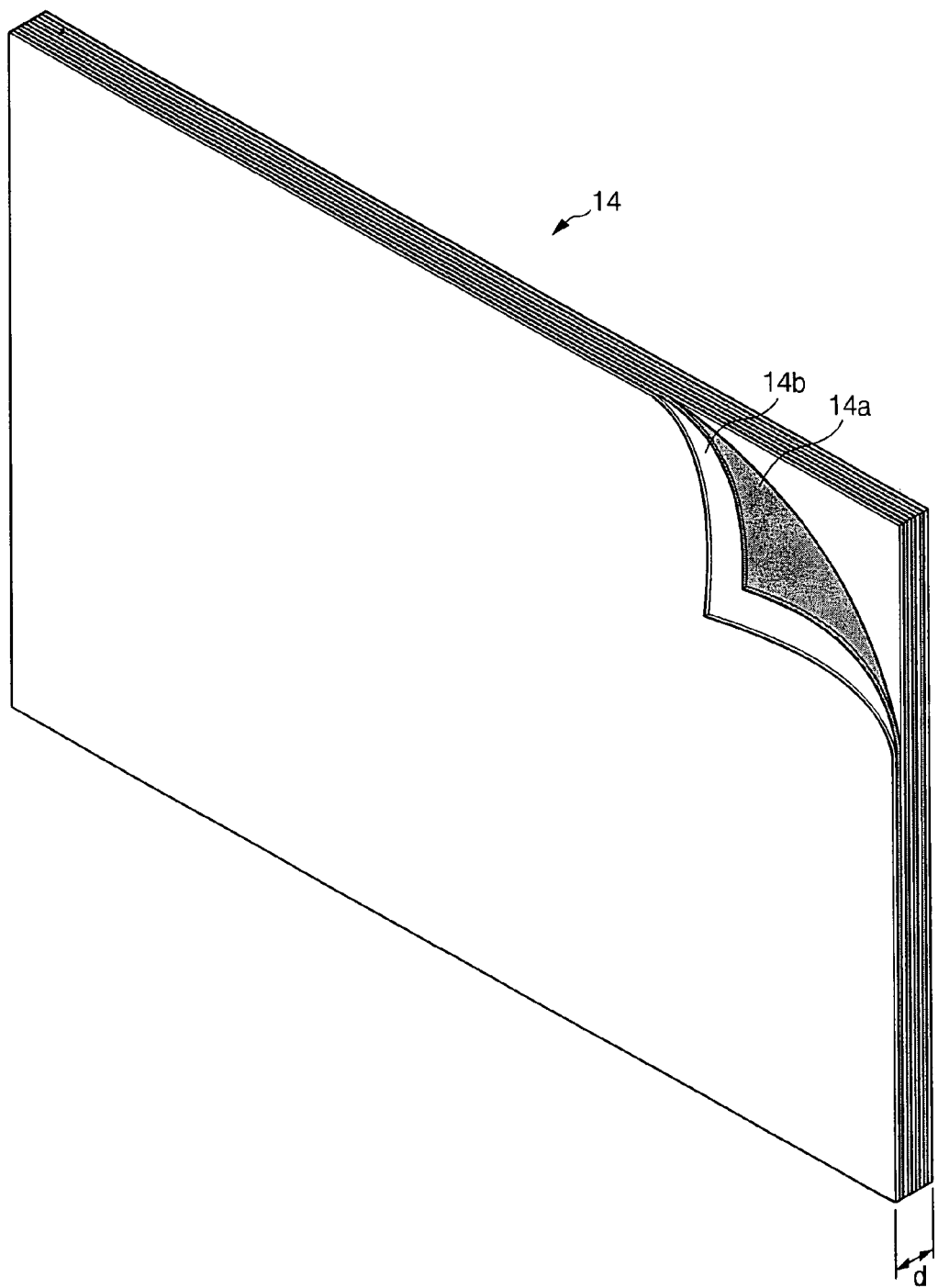
FIG. 2 is a perspective view of a thermal conduction medium of FIG. 1.

FIG. 1 is an exploded perspective view of a plasma display device according to an exemplary embodiment of the present invention, and FIG. 2 is a perspective view of a thermal conduction assembly of FIG. 1.

A plasma display device 10 includes a plasma display panel (PDP) 12 and a chassis base 16. The PDP 12 is mounted on the chassis base 16 with one of its faces adjacent to a face of the chassis base 16, whereas circuit elements 18 for driving the PDP 12 are mounted on the opposing face of the chassis base 16.

The chassis base 16 is substantially parallel to the PDP 12, and a thermal conduction medium is interposed therebetween. The thermal conduction medium closely contacts the chassis base 16 and the PDP 12 in order to discharge and spread heat generated by the PDP 12. A front cover (not shown) is positioned so as to cover exposed surfaces of the PDP 12, and a rear cover (not shown) is positioned so as to cover exposed surfaces of the chassis base 16. The front cover and the rear cover are then interconnected to complete the plasma display device 10.

The thermal conduction medium is an anisotropic composite sheet 14 that has thermal conductivity in a planar direction (i.e., any direction in the y-z plane in FIG. 1) that is greater than that in a direction of the thickness of the composite sheet 14 (i.e., the direction x in FIG. 1 which is normal to the y-z plane). Preferably, the thermal conductivity in the planar direction is between 5 and 500 times that in the thickness direction of the discharge sheet 14. As a result, the flow of heat in the thickness direction of the composite sheet 14 is minimized, while heat spread in the planar direction of the composite sheet 14 is increased. If the thermal conductivity in the planar direction is less than 5 times the thermal conductivity in the direction of the thickness of the composite sheet 14, the desired anisotropic characteristics are not realized. If, on the other hand, the thermal conductivity in the planar direction is greater than 500 times the thermal conductivity in the direction of the thickness of the composite sheet 14, it becomes necessary to increase the thickness of the composite sheet 14 as the planar area of the same is increased. This runs counter to efforts at minimizing the thickness of the plasma display device 10.

Preferably, the thermal conductivity in the planar direction is between 10 and 1000 W/mK. If the thermal conductivity in the planar direction is less than 10 W/mK, the thermal spread of the panel is insufficiently facilitated. On the other hand, if the thermal conductivity in the direction of the thickness of the composite sheet 14 exceeds 1000 W/mK, the same problem as described above is encountered, that is, it becomes necessary to increase the thickness of the composite sheet 14 in accordance with increases in the planar area of the same. This runs counter to efforts at realizing a slim profile of the plasma display device 10.

The composite sheet 14 having the properties as described above has a multi-layered structure in which a plurality of layers of different thermal conductivities is combined into a single unit. The composite sheet 14 of the exemplary embodiment of the present invention is realized by closely contacting 9 layers. The layers are placed adjacent to one another by alternating between a high thermal conductivity layer 14a and a low thermal conductivity layer 14b. However, the present invention is not limited to this configuration, and the composite sheet 14 may be formed having such an alternating configuration of 3 layers or more. Stated differently, the composite sheet 14 may be realized by stacking a few to a few tens of the high thermal conductivity layers 14a with one of the low conductivity layers 14b interposed between each pair of the high thermal conductivity layers 14a.

The high thermal conductivity layers 14a may be made of one or more of the following materials: carbon, graphite, carbon nanotubes (CNTs), copper, aluminum, gold, silver, bronze, iron, or zinc. The low thermal conductivity layers 14b may be made of a silicone- or acryl-based high polymer adhesive. That is, as a composite having good thermal conductivity and allowing for a planar structure, the high thermal conductivity layers 14a may be formed of a carbon-carbon composite, a structure that connects CNTs in a planar direction, or a structure that connects graphite in a planar direction. Further, the low thermal conductivity layers 14b are formed by filling spaces between the high thermal conductivity layers 14a with an adhesive of a low thermal conductivity to thereby complete the composite sheet 14. By forming the composite sheet 14 in this manner, anisotropic thermal conductivities are exhibited.

At least one of the outermost layers of the composite sheet 14 may be a low thermal conductivity layer 14b (see FIG. 2). For the composite sheet 14 of the exemplary embodiment described above, both of the outermost layers of the composite sheet 14 are the low thermal conductivity layers 14b.

Figure 3:
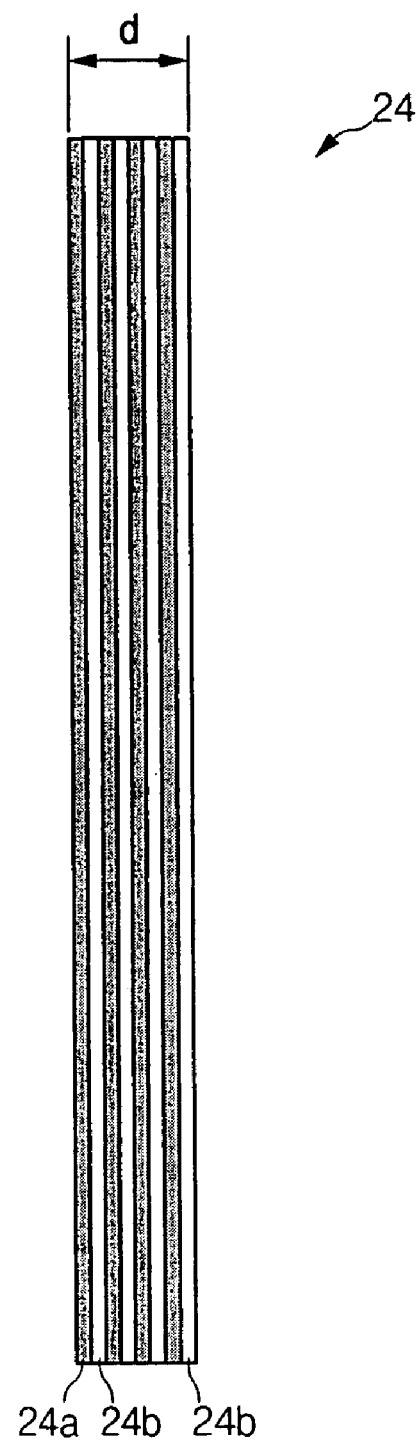
FIG. 3 is a side view of a thermal conduction medium according to another exemplary embodiment of the present invention.

However, with reference to FIG. 3, in a composite sheet 24 according to another exemplary embodiment of the present invention, only one of the two outermost layers is a lower thermal conductivity layer 24b, while the other outermost layer is a higher thermal conductivity layer 24a. Since these low thermal conductivity layers 14b and 24b are made of an adhesive, the adhesivity of the adjacent PDP 12 and/or chassis base 16 with the composite sheets 14 and 24 is increased.

Figure 4:
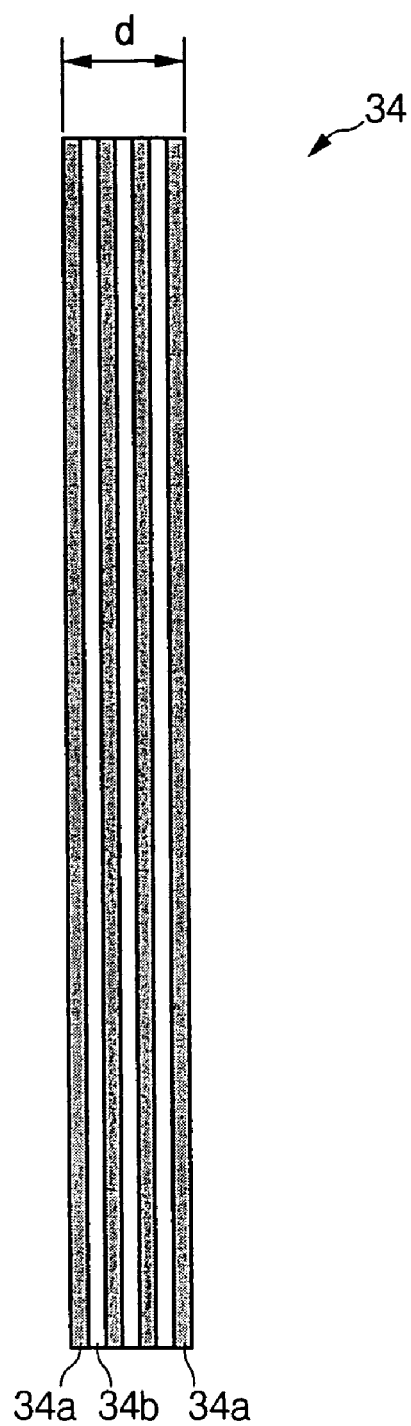
FIG. 4 is a side view of a thermal conduction medium according to yet another exemplary embodiment of the present invention.

Referring to FIG. 4, in yet another exemplary embodiment of the present invention, both of the outermost layers of a composite sheet 34 are high thermal conductivity layers 34a, while lower thermal conductivity layers 34b are limited to use as inner layers. In this case, an adhesive (not shown) is thinly applied to outer surfaces of these high thermal conductivity layers 34a occupying the outermost layers of the composite sheet 34, to thereby improve the adhesivity between this element and the PDP 12 as well as the chassis base 16.

In the above exemplary embodiments, the high thermal conductivity layers 14a, 24a, and 34a may be made of a single material, or may be made by differently combining two or more materials. For example, for the composite sheet 14, all of the high thermal conductivity layers 14a may be made of the same material or each may be made of a different material.

A thickness d of the composite sheets 14, 24, and 34 (see FIGS. 2, 3 and 4) may be determined by considering desired shock-absorbing qualities and thermal conductivity, and depending on the overall size of the PDP 12.

EXAMPLE

An aluminum filler was placed in a silicone basic material to produce a conventional isotropic heat discharge sheet having thermal conductivity of 0.8 W/mK (comparative example). Then, the heat discharge sheet was attached to a PDP. Further, high thermal conductivity layers were made of graphite and low thermal conductivity layers were made of a high polymer adhesive to produce a composite sheet having thermal conductivity of 6 W/mK in the direction of the thickness of the composite sheet and thermal conductivity of 240 W/mK in the planar direction (exemplary embodiment). The composite sheet of the exemplary embodiment was then attached to a PDP.

Subsequently, various measurements were taken to compare the comparative example with the exemplary embodiment. In particular, there were measurements of image sticking time, degree of bright image sticking (eye-detecting image sticking), and panel surface temperature. The results of the measurements are shown in Table 1 below.

Figure 5:
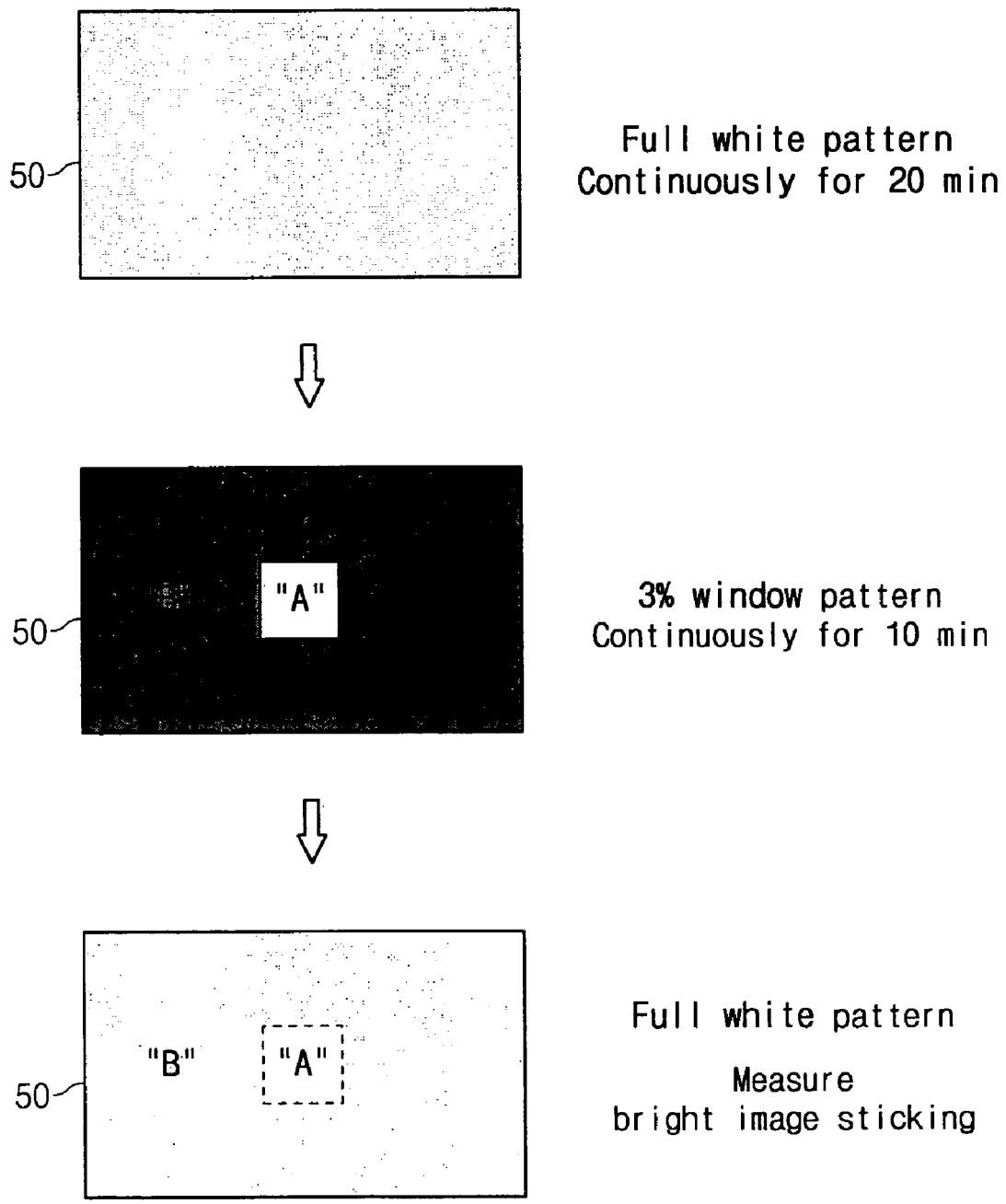
FIG. 5 is a schematic view used to describe the generation of bright image sticking as a result of the concentration of heat at a localized area.

The patterns 50 and pattern display times appearing in FIG. 5 were used. Following the application of a full white pattern to measure image sticking, there were measurements of the difference in brightness between window pattern A and area B, the time it takes for the difference in brightness between window pattern A and area B to reach 7 cd/m$^2$, and the time it takes for image sticking to visibly disappear (eye-detecting image sticking time). In addition, the maximum temperature of the panel during the entire testing time was measured. The tests were performed by exchanging only the sheets. In Table 1, Exemplary Embodiment 1 and Exemplary Embodiment 2 are composite sheets of the same structure.

TABLE 1

| Measurement | Comparative Example | Exemplary Embodiment 1 | Exemplary Embodiment 2 |
| --- | --- | --- | --- |
| Initial brightness difference [cd/m$^2$] (after 30 seconds) | 22 | 8 | 11 |
| Image sticking time [sec] (based on 7 cd/m$^2$) | 170 | 60 | 60 |
| Eye-detecting image sticking [sec] | 180 | 70 | 90 |
| Panel surface temperature [° C.] | 64 | 53 | 54 |

As shown in Table 1, the initial brightness difference, image sticking time, eye-detecting image sticking, and panel surface temperature are all reduced when the composite sheet of the Exemplary Embodiment is used in place of the conventional heat discharge sheet is used (Comparative Example).

In the plasma display device that includes the thermal conduction assembly of the present invention described above, an anisotropic composite sheet having thermal conductivity in a planar direction which is greater than that in a thickness direction of the sheet is interposed between the chassis base and the PDP. As a result, the accumulation of heat on the PDP is prevented such that the temperature of the same is more uniformly distributed, and the generation of bright image sticking is prevented.

Although embodiments of the present invention have been described in detail hereinabove in connection with certain exemplary embodiments, it should be understood that the invention is not limited to the disclosed exemplary embodiments but, on the contrary, the disclosure is intended to cover modifications and/or equivalent arrangements included within the spirit and scope of the present invention, as defined in the appended claims.

What is claimed is:

1. A plasma display device, comprising:
   a plasma display panel;
   a chassis base disposed substantially parallel to the plasma display panel; and
   a thermal conduction medium interposed between the plasma display panel and the chassis base;
   wherein the thermal conduction medium is made of a composite sheet comprising at least one high thermal conductivity layer, made of a material of a high thermal conductivity, alternating with at least one low thermal conductivity layer, made of a material of a low thermal conductivity less than the high thermal conductivity;
   wherein said at least one high thermal conductivity layer is made of at least one material selected from a group consisting of carbon, carbon nanotubes, copper, aluminum, gold, silver, bronze, iron, and zinc;
   wherein said at least one low thermal conductivity layer is made of an acryl-based high polymer adhesive; and
   wherein the thermal conductivity of the composite sheet in the planar direction is in a range of 5 times to 500 times the thermal conductivity in the thickness direction thereof.

2. The plasma display device of claim 1, wherein the thermal conductivity of the composite sheet in the planar direction is in a range of 10 W/mK to 1000 W/mK.

3. The plasma display device of claim 1, wherein the composite sheet has a multi-layered structure of at least three layers, and neighboring layers have different thermal conductivities.

4. The plasma display device of claim 1, wherein at least one of two outermost layers of the composite sheet is coated with an adhesive.

5. A plasma display device, comprising:
- a plasma display panel;
- a chassis base disposed substantially parallel to the plasma display panel; and
- a thermal conduction medium interposed between, and closely contacting, the plasma display panel and the chassis base;
- wherein the thermal conduction medium is made of a composite sheet comprising at least one high thermal conductivity layer made of a material of a high thermal conductivity, and at least one low thermal conductivity layer made of a material of a low thermal conductivity less than the high thermal conductivity;
- wherein said at least one high thermal conductivity layer is made of at least one material selected from a group consisting of carbon, carbon nanotubes, copper, aluminum, gold, silver, bronze, iron, and zinc;
- wherein said at least one low thermal conductivity layer is made of an acryl-based high polymer adhesive; and
- wherein the thermal conductivity of the composite sheet in the planar direction is in a range of 5 times to 500 times the thermal conductivity in the thickness direction thereof.

6. The plasma display device of claim 5, wherein the thermal conductivity of the composite sheet in the planar direction is in a range of 10 W/mK to 1000 W/mK.

7. The plasma display device of claim 5, wherein the composite sheet has a multi-layered structure of at least three layers, and neighboring layers have different thermal conductivities.

8. The plasma display device of claim 5, wherein at least one of two outermost layers of the composite sheet is coated with an adhesive.

9. A plasma display device, comprising:
- a plasma display panel;
- a chassis base disposed substantially parallel to the plasma display panel; and
- a thermal conduction medium interposed between, and closely contacting, the plasma display panel and the chassis base;
- wherein the thermal conduction medium is made of a composite sheet comprising at least one high thermal conductivity layer, made of a material of a high thermal conductivity, alternating with at least one low thermal conductivity layer, made of a material of a low thermal conductivity less than the high thermal conductivity;
- wherein said at least one high thermal conductivity layer is made of at least one material selected from a group consisting of carbon, carbon nanotubes, copper, aluminum, gold, silver, bronze, iron, and zinc; and
- wherein the thermal conductivity of the composite sheet in the planar direction is in a range of 5 times to 500 times the thermal conductivity in the thickness direction thereof.

10. The plasma display device of claim 9, wherein the thermal conductivity of the composite sheet in the planar direction is in a range of 10 W/mK to 1000 W/mK.

11. The plasma display device of claim 9, wherein the composite sheet has a multi-layered structure of at least three layers, and neighboring layers have different thermal conductivities.

12. The plasma display device of claim 9, wherein at least one of two outermost layers of the composite sheet is coated with an adhesive.

13. A thermal conduction medium made of a composite sheet, comprising:
- at least one high thermal conductivity layer made of a material of a high thermal conductivity; and
- at least one low thermal conductivity layer made of a material of a low thermal conductivity less than the high thermal conductivity, said at least one low thermal conductivity layer alternating with said at least one high thermal conductivity layer;
- wherein said at least one high thermal conductivity layer is made of at least one material selected from a group consisting of carbon, carbon nanotubes, copper, aluminum, gold, silver, bronze, iron, and zinc;
- wherein said at least one low thermal conductivity layer is made of an acryl-based high polymer adhesive; and
- wherein a thermal conductivity of the composite sheet in a planar direction of the composite sheet is in a range of 5 times to 500 times a thermal conductivity of the composite sheet in a thickness direction thereof.

14. The thermal conduction medium of claim 13, wherein a thermal conductivity of the composite sheet in a planar direction is in a range of 10 W/mK to 1000 W/mK.

15. The thermal conduction medium of claim 13, wherein the composite sheet has a multi-layered structure comprising at least three layers, and neighboring layers have different thermal conductivities.

16. The thermal conduction medium of claim 13, wherein at least one of two outermost layers of the composite sheet is coated with an adhesive.

* * * * *